United States Patent [19]

Fujiyama et al.

[11] Patent Number: 4,599,971
[45] Date of Patent: Jul. 15, 1986

[54] VAPOR DEPOSITION FILM FORMING APPARATUS

[75] Inventors: Yasutomo Fujiyama; Shotaro Okabe, both of Kawasaki, Japan

[73] Assignee: Canon Kabushiki Kaisha, Tokyo, Japan

[21] Appl. No.: 731,334

[22] Filed: May 6, 1985

Related U.S. Application Data

[63] Continuation of Ser. No. 650,164, Sep. 13, 1984, abandoned.

[30] Foreign Application Priority Data

Sep. 14, 1983 [JP] Japan .................................. 58-168378

[51] Int. Cl.⁴ .............................................. C23C 13/08
[52] U.S. Cl. ..................................... 118/723; 118/50.1; 118/719; 427/39
[58] Field of Search .......................... 430/128; 204/298; 427/39, 74; 118/719, 730, 723, 50.1, 715

[56] References Cited

U.S. PATENT DOCUMENTS 4,226,208 10/1980 Nishida et al. ................... 118/719 X
4,369,730 1/1983 Izu et al. ............................ 118/723
4,466,380 8/1984 Jansen et al. .................... 118/723 X
4,482,419 11/1984 Tsukada et al. ...................... 204/298
4,501,766 2/1985 Suzuki et al. .................... 118/723 X
4,523,544 1/1985 Harada et al. ....................... 118/702

FOREIGN PATENT DOCUMENTS 3217708 12/1982 Fed. Rep. of Germany .
2114160 8/1983 United Kingdom .

Primary Examiner—Norman Morgenstern
Assistant Examiner—Bernard F. Plantz
Attorney, Agent, or Firm—Fitzpatrick, Cella, Harper & Scinto

[57] ABSTRACT

In a vapor deposition film forming apparatus having a plurality of reactors each having a substrate and an electrode oppositely arranged in a vacuum chamber and means for applying a voltage thereacross to react or decompose reaction gas introduced into the vacuum chamber, the reactors are arranged on a circumference of a circle and coaxial cables having substantially equal impedance radially extend to the reactors from a matching circuit located at the center of the circle.

1 Claim, 4 Drawing Figures

VAPOR DEPOSITION FILM FORMING APPARATUS

This application is a continuation of application Ser. No. 650,164 filed Sept. 13, 1984, now abandoned.

BACKGROUND OF THE INVENTION

1. Field of the Invention

The present invention relates to an improvement in a vapor deposition film forming apparatus, and more particularly to an improvement in an apparatus for forming a photo-conductive film, a semiconductor film, an inorganic insulative film or an organic resin film on a conductive substrate by a plasma CVD method.

2. Description of the Prior Art

In a prior art apparatus for forming an electrophotographic photo-conductive drum by depositing an amorphous silicon photo-conductive film on a cylindrical metal substrate surface such as an aluminum surface by a plasma CVD method, a cylindrical cathode electrode which is coaxial with the substrate is arranged so that a glow discharge occurs between the electrode and the substrate. An example of such an apparatus is shown in FIG. 1 in a longitudinal sectional view. Numeral 11 denotes a cylindrical cathode electrode which is coaxial with a cylindrical substrate (anode electrode) 12. Numeral 13 denotes a doughnut-shaped electrical insulator, numeral 14 denotes a vacuum chamber wall, numeral 15 denotes an RF power supply, numeral 16 denotes a reaction gas discharge pipe, numeral 17 denotes a vacuum exhaust pipe, numeral 18 denotes a substrate heater, numeral 19 denotes a substrate rotating mechanism and numeral 20 denotes ground.

In this apparatus, since one substrate is arranged in one reactor, distribution of thickness of the amorphous silicon film which is easily affected by a gas flow path can be readily adjusted, and an excellent film characteristic is obtained because of excellent discharge stability.

For a mass-production by such an apparatus, it is necessary to increase the number of reactors. It is usually required for independent control of discharge parameter to provide a reaction gas supply system, a vacuum exhaust system and an RF power supply separately for each reactor. FIG. 2 shows a diagram of a multi-reactor apparatus in which four reactors are used. Numeral 1 denotes a reactor, numeral 2 denotes a matching circuit, numeral 3 denotes an RF power supply, numeral 4 denotes a coaxial cable, numeral 5 denotes a vacuum pump, numeral 6 denotes an exhaust pipe, numeral 7 denotes a reaction gas flow rate controller and numeral 8 denotes a reaction gas supply pipe.

As the number of reactors increases as shown in FIG. 2, associated facilities also increase proportionally and the parameters must be controlled for each reactor. Thus, in the prior art apparatus, it has been inevitable that the increase of the number of reactors increased the associated facilities and complicated the control operation.

When a number of deposition films are to be formed, if the RF power supply, matching circuit and coaxial cable are separately arranged for each reactor as was done in the prior art apparatus, the discharge parameters can be independently controlled but impedance matching should be individually adjusted and it is difficult to form the deposition films with the same conditions in the respective reactors.

Further, the greater the number of the deposition films to be formed, the more are the reactors as well as the RF power supply system facilities including the RF power supplies for supplying RF powers to the reactors and the matching circuits for matching the impedances of the RF glow discharges required.

SUMMARY OF THE INVENTION

It is an object of the present invention to provide a vapor deposition film forming apparatus having a plurality of reactors which does not require additional associated facilities and does not complicate the control operation as the number of reactors increases.

It is another object of the present invention to provide a vapor deposition film forming apparatus having a substantially equal impedance in each of the reactors.

It is another object of the present invention to provide a vapor deposition film forming apparatus having a plurality of reactors for forming deposition films on substrates by arranging the substrates and opposing electrodes in vacuum chambers and applying voltages thereacross to react or decompose reaction gas introduced into the vacuum chambers, wherein center axes of the reactors are arranged on the circumference of a circle and coaxial cables having an equal impedance radially extends from a matching circuit located at the center of the circle to the respective reactors.

DETAILED DESCRIPTION OF THE PREFERRED EMBODIMENT

Figure 3:
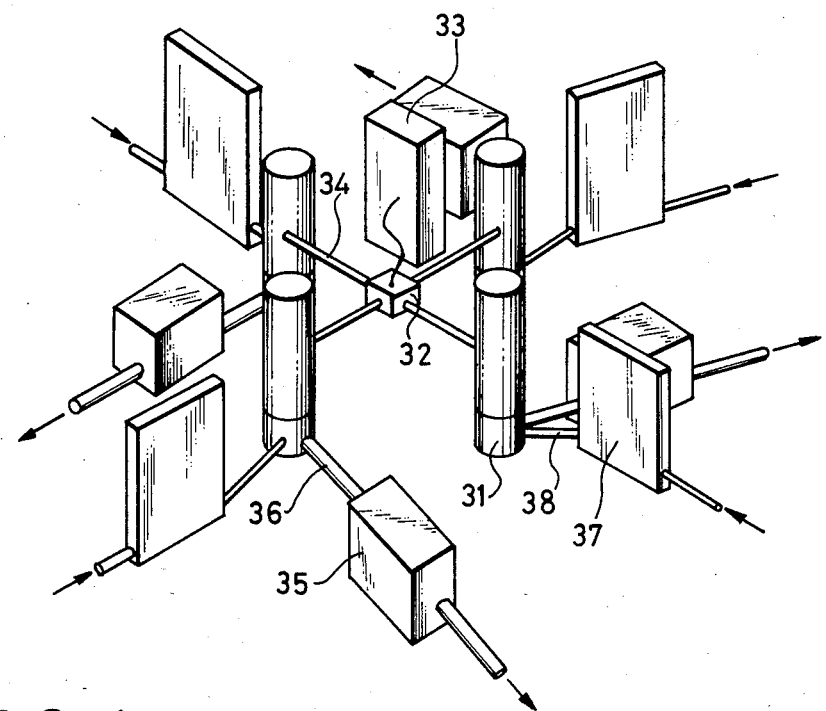
FIG. 3 is a diagram of an apparatus of the present invention.
Figure 4:
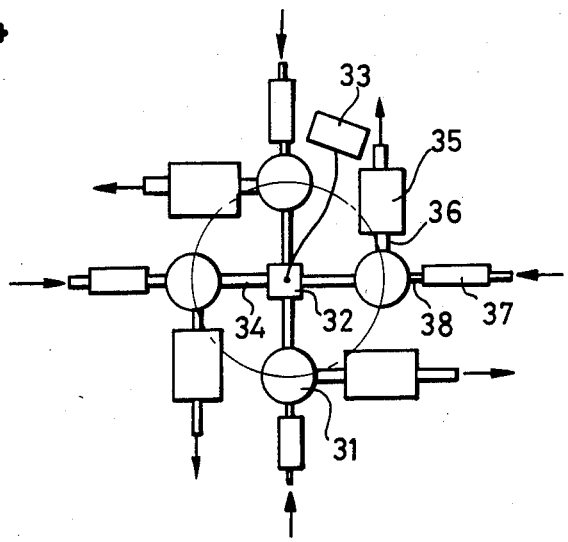
FIG. 4 is a plan view of the apparatus of FIG. 3.

FIG. 3 is a diagram of a vapor deposition film forming apparatus of the present invention having four reactors, and FIG. 4 is a plan view thereof.

Figure 1:
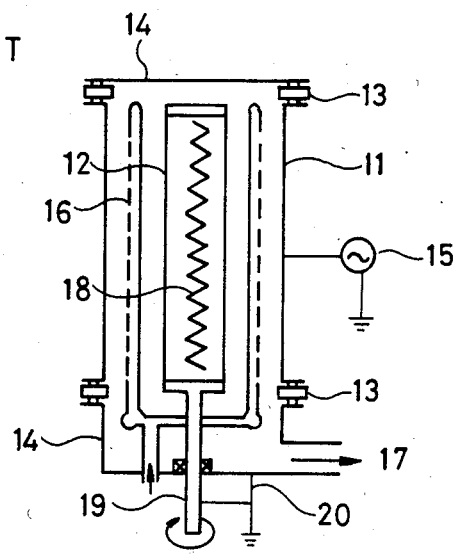
FIG. 1 is a longitudinal sectional view of a reactor of a vapor deposition film forming apparatus.
Figure 2:
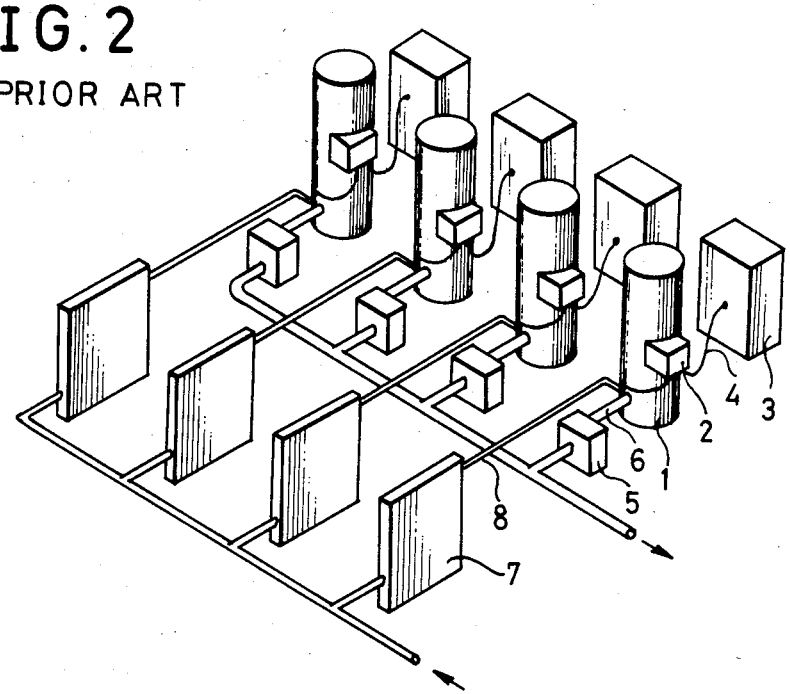
FIG. 2 is a diagram of a prior art apparatus for mass-producing deposition films.

Numeral 31 denotes a reactor similar to that shown in FIG. 1. Four such reactors are arranged on the circumference of a circle. In each reactor, there are provided a vacuum evacuation pump 35, an exhaust pipe 36, a reaction gas supply pipe 38 for supplying reaction gas and a reaction gas flow rate controller 37 for controlling a flow rate of the reaction gas to the reactor. One set of an RF power supply 33 having a sufficient capacity to supply glow discharge powers to the four reactors and a matching circuit 32 for matching impedances of the RF glow discharges is provided. The matching circuit 32 is located at the center of the circle along which the four reactors are arranged, and coaxial cables 34 extend from the matching circuit 32 to the reactors.

In the present invention, the structure of the prior art reactor is not modified and a plurality of such reactors are arranged on the circumference of the circle and the common RF power supply and the common matching circuit to those reactors are provided, and the coaxial cables extend from the matching circuit located at the center of the circle so that the apparatus and the control operation are simplified.

The number of reactors may be increased by simply increasing the radius of the circle along which the reactors are arranged.

The materials, diameters, shapes and lengths of the coaxial cables are selected such that the same amount of RF power is supplied to each of the reactors. Preferably, those cables have the same material, diameter, shape and length.

In the present invention, a single set for applying the glow discharge powers to the cathode electrodes of the reactors, such as the RF power supply and the matching circuit is provided. Similarly, a single set of reaction gas supply system and a single set of exhaust system may be used.

In order to form deposition films by the apparatus shown in FIGS. 3 and 4, deposition chambers in the reactors are vacuumed to $10^1$–$10^{-3}$ Torr, and reaction gas for forming the deposition films and necessary carrier gas or dopant gas for introducing impurities into the films to be formed are introduced at desired pressure and flow rate. For example, in order to form hydrogenated amorphous silicon (a-Si : H) films on substrates, $SiH_4$ gas, $Si_2H_6$ gas or combination of those gases and appropriate amount of $H_2$, He or Ar is introduced into the deposition chambers. The deposition chambers are vacuumed in accordance with the above process, the substrate temperature is set to 200°–400° C., gas mixture consisting of 5–40% by volume of $SiH_4$ and 95–60% by volume of $H_2$ is introduced into the deposition chambers at a gas pressure of 0.1–2 Torr and at a gas flow rate of 0.1–2 l/min, an RF power is applied to the cathode electrodes from the RF power supply through the matching circuit to excite glow discharges, and the reaction gas is decomposed to form the a-Si : H films on the substrates.

A source gas may be silane ($SiH_4$, $Si_2H_6$, $Si_3H_8$, $Si_4H_{10}$ as amorphous silicon film forming material, $H_2$ as base gas, rare gas, $SiF_4$ for introducing fluorine, $B_2H_6$, $PH_3$, $AsH_3$ for controlling a p or n conductivity, $N_2$, $NH_3$ for introducing nitrogen, $N_2O$, NO for introducing oxygen, hydrocarbon such as $CH_4$, $C_2H_4$ for introducing carbon or other gas known to contain atoms which can be introduced by the plasma CVD method. Those gases may be combined at predetermined proportions by a mass flow controller.

The present apparatus may be applied to form an insulative film such as $Si_3N_4$, SiC, $SiO_2$ or SiO. The present apparatus may also be applied to form an organic resin film.

An embodiment to form the a-Si:H film by the present apparatus is explained below.

The a-Si:H film was formed by the vapor deposition film forming apparatus shown in FIGS. 3 and 4 by using gas mixture of $SiH_4$ gas and $H_2$ gas as the reaction gas. The reactors were vacuumed to 1 Torr by the vacuum pumps 35 and the substrates were previously heated to 300° C. The reaction gas was controlled by the reaction gas flow rate controller such that the $SiH_4$ gas flow rate was 400 cc/min and the $H_2$ gas flow rate was 800 cc/min and the gas pressure was 0.5 Torr. The reaction gas was introduced through the reaction gas supply pipes 38 so that the gas was stably supplied to the deposition chambers. RF power of 100 watts at the frequency of 13.56 MHz was applied to the cathode electrodes from the RF power supply 33 to generate glow discharges between the cathodes and the grounded substrates to form the a-Si:H films on the substrates.

The formed a-Si:H films had as excellent dark resistance characteristic and photo-conductive characteristic and uniform films as those formed by the prior art single-reactor apparatus shown in FIG. 1.

What is claimed is:

1. A vapor deposition film forming apparatus comprising a plurality of reactors each having means for holding a substrate and an electrode arranged in a vacuum chamber and means for applying a voltage thereacross to react or decompose reaction gas introduced into said vacuum chamber, wherein center axes of said reactors are arranged on the circumference of a circle and coaxial cables having substantially equal impedance radially extend to said reactors from a matching circuit located at the center of said circle.

* * * * *